(12) United States Patent
Park

(10) Patent No.: US 6,842,065 B2
(45) Date of Patent: Jan. 11, 2005

(54) ELECTRICAL FUSE PROGRAMMING CONTROL CIRCUIT

(75) Inventor: Jong Tai Park, Kyoungki-do (KR)

(73) Assignee: Hynix Semiconductor, Inc., Kyoungki-Do (KR)

(*) Notice: Subject to any disclaimer, the term of this patent is extended or adjusted under 35 U.S.C. 154(b) by 35 days.

(21) Appl. No.: 10/331,528

(22) Filed: Dec. 30, 2002

(65) Prior Publication Data

US 2004/0012070 A1 Jan. 22, 2004

(30) Foreign Application Priority Data

Jul. 18, 2002 (KR) .................................. 10-2002-0042103

(51) Int. Cl.$^7$ ................................................ H01H 7/76
(52) U.S. Cl. ........................................ 327/525; 327/526
(58) Field of Search .................................. 327/525, 526

(56) References Cited

U.S. PATENT DOCUMENTS 4,730,129 A * 3/1988 Kunitoki et al. ............ 327/525
5,361,001 A * 11/1994 Stolfa ........................... 327/530
5,600,277 A * 2/1997 Koelling ...................... 327/526
6,621,324 B2 * 9/2003 Fifield et al. ................ 327/525
6,703,885 B1 * 3/2004 Fan et al. ..................... 327/308

* cited by examiner

*Primary Examiner*—Terry D. Cunningham
(74) *Attorney, Agent, or Firm*—Marshall, Gerstein & Borun LLP

(57) ABSTRACT

An electrical fuse programming control circuit includes a plurality of fuse blocks each having a plurality of electrical fuses and an end fuse block. When all of the fuse blocks are programmed, the end fuse block is enabled and generates a programming control signal. The electrical fuse programming control circuit also includes a comparing unit that selectively transmits a fuse cutting signal to the plurality of fuse blocks in response to the programming control signal from the end fuse block. When programming of all of the fuse blocks is complete, reprogramming of the fuse blocks is not performed when an illegal program command is provided as an input.

14 Claims, 5 Drawing Sheets

ELECTRICAL FUSE PROGRAMMING CONTROL CIRCUIT

BACKGROUND

1. Technical Field

The present disclosure relates to an electrical fuse programming control circuit for a semiconductor device and, more particularly, to an electrical fuse programming control circuit that can program a fuse by using an end fuse block, even when an illegal program command is provided as an input.

2. Description of the Related Art

In general, a laser fuse is programmed by directly rupturing a fuse that is selected by an external physical force (laser beam). Conversely, an electrical fuse is programmed by transmitting an electrical stress to the selected electrical fuse in response to an externally-inputted program command, and thereby rupturing the electrical fuse.

When the electrical fuse is used for repair, a desired fuse block is selected from among a plurality of fuse blocks according to specific information (e.g., address). An electrical stress is then transmitted to the selected fuse block to program the electrical fuse. More specifically, when information stored in fuse blocks that are programmed in a normal mode is the same as an externally-inputted address, the externally-inputted address does not access a normal memory cell array, but instead enables a control signal to access a repair memory cell as the repair address.

FIG. 1 is an exemplary block diagram that depicts a conventional electrical fuse programming control circuit for repair. In this example, the electrical fuse is formed as an anti fuse. The electrical fuse programming control circuit for repair includes a plurality of fuse blocks FB1~FBn having a plurality of anti fuses (not shown). In addition, the electrical fuse programming control circuit for repair includes a control signal generating unit 1 adapted to enable a control signal CON when information stored in the fuse blocks FB1~FBn that are programmed in the normal mode is the same as an externally-inputted address ADD. The individual fuse blocks FB1~FBn are selected in response to the externally-inputted repair addresses RADD<1:n>. The selected fuse blocks enter into an electrical fuse programming mode, and are thereby programmed in response to a fuse cutting signal FCS.

When the electrical fuse is used for voltage trimming, a desired fuse block is selected from among the plurality of fuse blocks in response to a control signal. The control signal is adapted to select specific information such as a specific level. An electrical stress is then transmitted to the selected fuse block to program the electrical fuse. Accordingly, a select signal for selecting the specific level is enabled based on the information stored in the fuse blocks.

FIG. 2 is an exemplary block diagram that depicts a conventional electrical fuse programming control circuit for voltage level trimming. The electrical fuse programming control circuit for voltage level trimming includes a plurality of fuse blocks FB1~FBn having a plurality of anti fuses (not shown). The electrical fuse programming control circuit for voltage level trimming also includes a decoding unit 2 adapted to decode the information stored in the anti fuses of the fuse blocks FB1~FBn, and generate a select signal SEL for selecting a desired voltage level. The individual fuse blocks FB1~FBn are selected in response to the voltage control signals CTRL1~CTRLn. When the fuse cutting signal FCS is enabled, the selected fuse block enters into the electrical fuse programming mode to be programmed.

When the electrical fuse is used for mode selection, a desired fuse block is selected in response to a control signal. The control signal is adapted to select specific information such as specific mode. An electrical stress is then transmitted to the selected fuse block to program the electrical fuse. Accordingly, a mode select signal for selecting the specific mode is enabled based on the information stored in the fuse blocks.

However, when a device utilizing the electrical fuse is used in a system, if an illegal program command is provided to the programmed fuses as an input, the device is configured based on the illegal information (i.e., address, level, mode, etc.). As a result, an illegal reprogramming operation is performed.

SUMMARY

An electrical fuse programming control circuit that is adapted to prevent reprogramming when an illegal program command is provided as an input is disclosed. The electrical fuse programming control circuit includes a plurality of fuse blocks each having a plurality of electrical fuses, wherein each of the plurality of fuse blocks is selected in response to a fuse block select signal, and wherein each of the plurality of fuse blocks is programmed in response to a fuse cutting signal. The electrical fuse programming circuit also includes an end fuse block that is enabled in response to an end control signal, wherein the end control signal is enabled when all of the fuse blocks are programmed, and wherein the end fuse block is adapted to generate a programming control signal. The electrical fuse programming circuit further includes a comparing unit adapted to selectively transmit the fuse cutting signal to the plurality of fuse blocks in response to the programming control signal.

DETAILED DESCRIPTION

Figure 1:
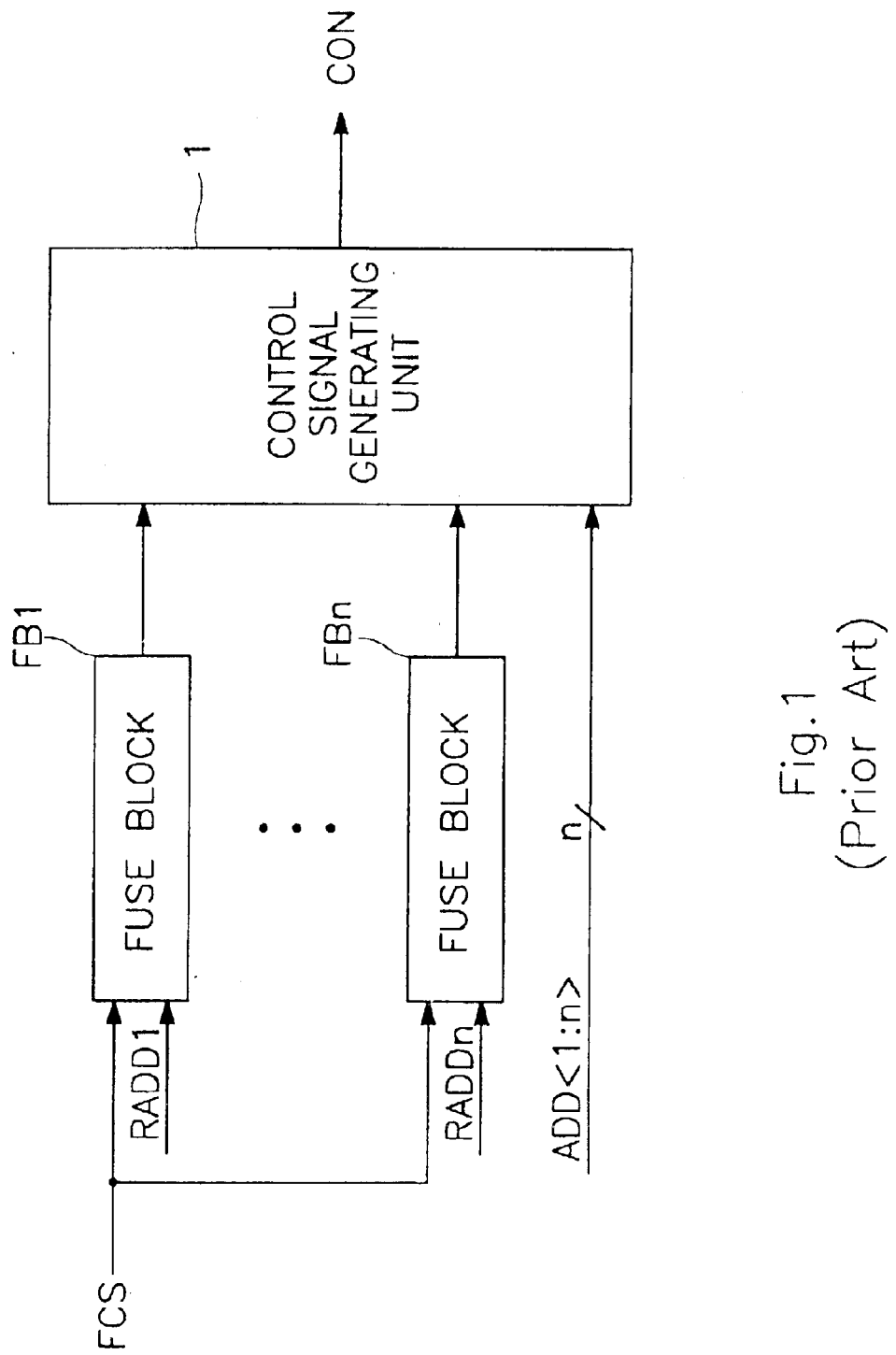
FIG. 1 is an exemplary block diagram that depicts a conventional electrical fuse programming control circuit for repair.
Figure 2:
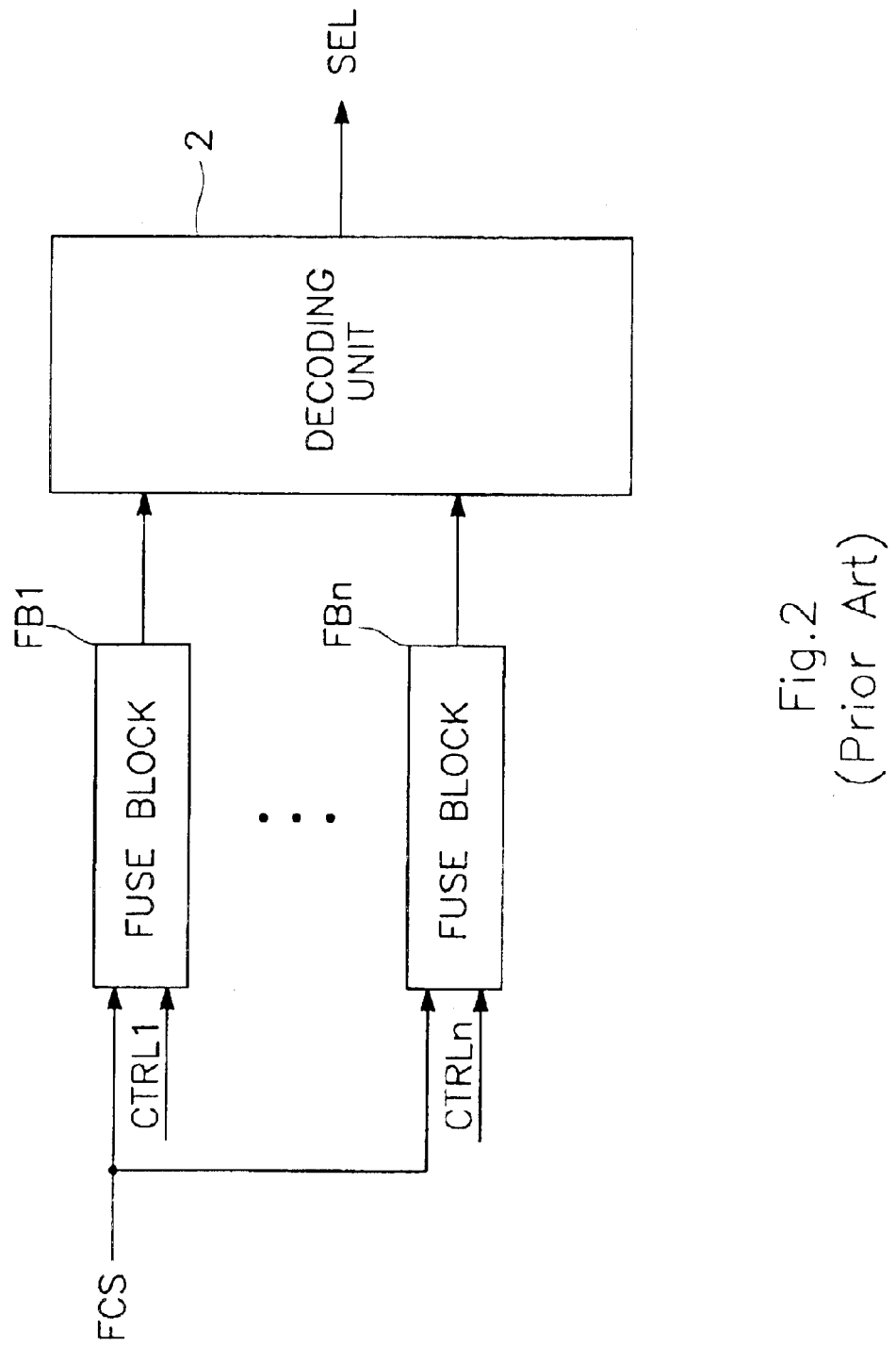
FIG. 2 is an exemplary block diagram that depicts a conventional electrical fuse programming control circuit for voltage level trimming.
Figure 3:
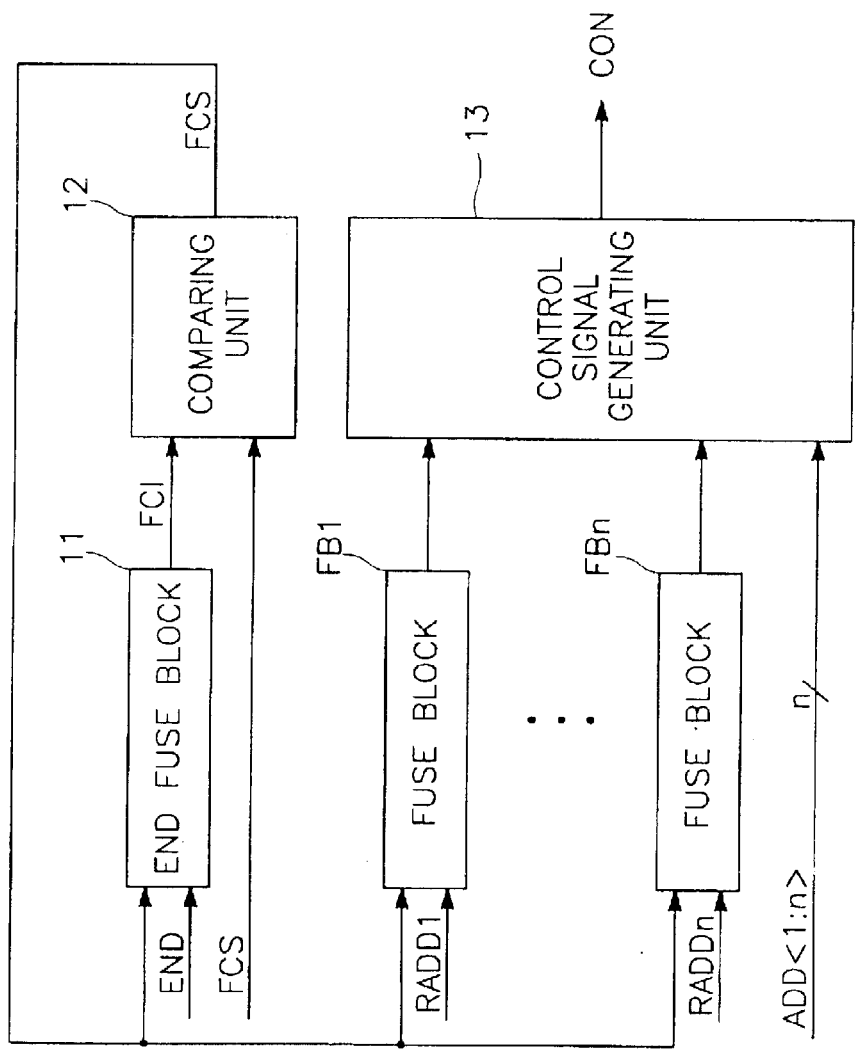
FIG. 3 is an exemplary block diagram that depicts an electrical fuse programming control circuit for repair in accordance with a first embodiment of the present disclosure.

FIG. 3 is an exemplary block diagram that depicts an electrical fuse programming control circuit for repair in accordance with a first embodiment of the present disclosure. In this embodiment, an electrical fuse is formed as an anti fuse. The electrical fuse programming control circuit for repair includes a plurality of fuse blocks FB1~FBn having a plurality of anti fuses (not shown). The electrical fuse programming control circuit for repair also includes an end fuse block 11 adapted to generate a programming control signal FCI that is enabled in response to an end control signal END. The end control signal END is enabled when all of the fuse blocks are programmed, and the end fuse block 11 is programmed in response to the fuse cutting signal FCS. The electrical fuse programming control circuit for repair further includes a comparing unit 12 adapted to selectively transmit the fuse cutting signal FCS to the plurality of fuse blocks FB1~FBn in response to the programming control signal FCI that is generated by the end fuse block 11. Finally, the electrical fuse programming control circuit for repair includes a control signal generating unit 13 adapted to enable a control signal CON when information stored in the fuse blocks FB1~FBn is the same as an externally-inputted address ADD. In this embodiment, the end control signal END, which is enabled when all of the fuse blocks FB1~FBn are programmed, uses an address or command that is not used for fuse programming.

The fuse blocks FB1~FBn are selected in response to externally-inputted repair addresses RADD<1:n>. The selected fuse blocks enter into an electrical fuse programming mode, and are thereby programmed in response to the fuse cutting signal FCS. When all of the fuse blocks FB1~FBn are programmed, the end control signal END is enabled to rupture the anti fuses of the end fuse block 11, and to thereby enable the programming control signal FCI. As a result, the comparing unit 12 does not transmit the fuse cutting signal FCS when the programming control signal FCI is enabled. In other words, when programming of all of the fuse blocks FB1~FBn is complete, the comparing unit 12 does not transmit the fuse cutting signal FCS when the programming control signal FCI is enabled, even if an illegal program command is inputted to enable the fuse cutting signal FCS. As a result, an electrical stress is not transmitted to the anti fuses of the fuse blocks FB1~FBn in response to the fuse cutting signal FCS.

Figure 4:
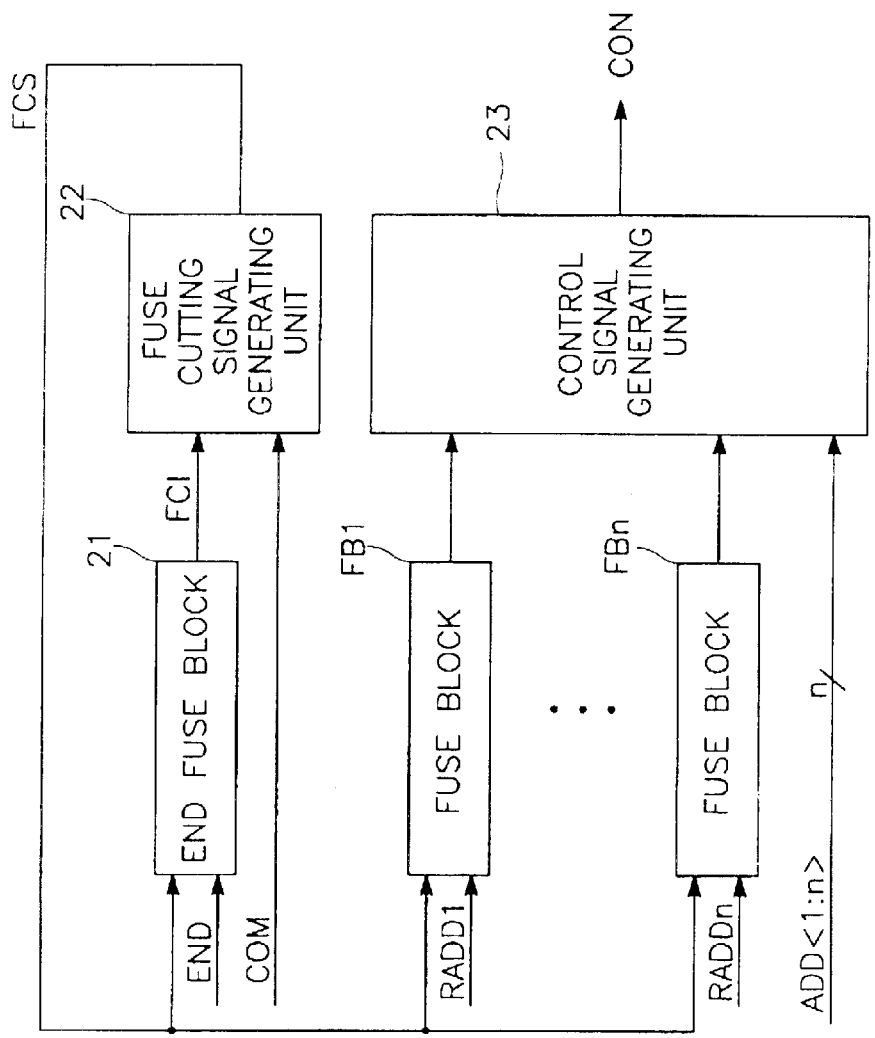
FIG. 4 is an exemplary block diagram that depicts an electrical fuse programming control circuit for repair in accordance with a second embodiment of the present disclosure.

FIG. 4 is an exemplary block diagram that depicts an electrical fuse programming control circuit for repair in accordance with a second embodiment of the present disclosure. The electrical fuse programming control circuit for repair includes a plurality of fuse blocks FB1~FBn, an end fuse block 21, a control signal generating unit 23, and a fuse cutting signal generating unit 22. In this embodiment, the plurality of fuse blocks FB1~FBn, the end fuse block 21, and the control signal generating unit 23 have a generally similar structure and operation as the plurality of fuse blocks FB1~FBn, the end fuse block 11, and the control signal generating unit 13 of the electrical fuse programming control circuit for repair shown in FIG. 3. Thus, detailed discussion thereof is omitted.

The fuse cutting signal generating unit 22, which corresponds to the comparing unit 12 shown in FIG. 3, decodes an externally-inputted program command COM, and selectively generates a fuse cutting signal FCS in response to a programming control signal FCI generated by the end fuse block 21. When the program command COM is externally inputted at an initial stage, the fuse cutting signal generating unit 22 generates the fuse cutting signal FCS, and programs the selected fuse blocks corresponding to the inputted repair addresses RADD<1:n>. When all of the fuse blocks FB1~FBn are programmed, an end control signal END is enabled to rupture the anti fuses (not shown) of the end fuse block 21, and to thereby enable the programming control signal FCI.

When the programming control signal FCI is enabled, the fuse cutting signal generating unit 22 does not generate the fuse cutting signal FCS, even when the illegal program command COM is externally inputted. In other words, when programming of all of the fuse blocks FB1~FBn is complete, the fuse cutting signal generating unit 22 does not generate the fuse cutting signal FCS, even if the illegal program command COM is externally inputted. As a result, an electrical stress is not transmitted to the anti fuses of the fuse blocks FB1~FBn.

Figure 5:
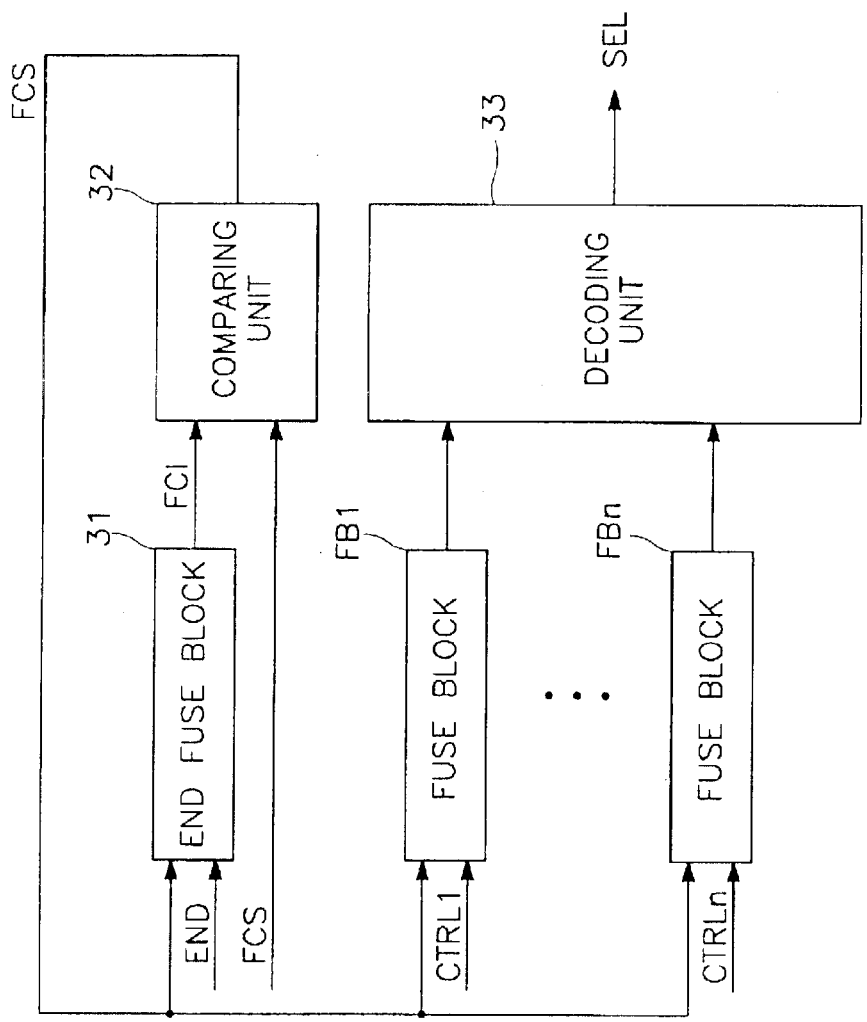
FIG. 5 is an exemplary block diagram that depicts an electrical fuse programming control circuit for voltage level trimming in accordance with the present disclosure.

FIG. 5 is an exemplary block diagram that depicts an electrical fuse programming control circuit for voltage level trimming in accordance with the present disclosure. The electrical fuse programming control circuit for voltage level trimming includes a plurality of fuse blocks FB1~FBn having a plurality of anti fuses (not shown). The electrical fuse programming control circuit for voltage level trimming also includes an end fuse block 31 adapted to generate a programming control signal FCI that is enabled in response to an end control signal END. The end control signal END is enabled when all of the fuse blocks FB1~FBn are programmed, and the end fuse block 31 is programmed in response to the fuse cutting signal FCS. The electrical fuse programming control circuit for voltage level trimming further includes a comparing unit 32 adapted to selectively transmit the fuse cutting signal FCS in response to the programming control signal FCI generated by the end fuse block 31. Finally, the electrical fuse programming control circuit for voltage level trimming includes a decoding unit 33 adapted to decode information stored in the anti fuses of the fuse blocks FB1~FBn, and generate a select signal SEL for selecting the desired voltage level.

The individual fuse blocks FB1~FBn are selected in response to the voltage control signals CTRL1~CTRLn. Thereafter, when the fuse cutting signal FCS is enabled, the selected fuse blocks enter into the electrical fuse programming mode to be programmed. After all of the fuse blocks FB1~FBn are programmed, the end control signal END is enabled to rupture the anti fuses of the end fuse block 31, and to thereby enable the programming control signal FCI. As a result, the comparing unit 32 does not transmit the fuse cutting signal FCS when the programming control signal FCI is enabled. In other words, when programming of all of the fuse blocks FB1~FBn is complete, the comparing unit 32 does not transmit the fuse cutting signal FCS when the programming control signal FCI is enabled, even if an illegal program command is inputted and the fuse cutting signal FCS is enabled. Therefore, an electrical stress is not transmitted to the anti fuses of the fuse blocks FB1~FBn in response to the fuse cutting signal FCS. Here, the end control signal END uses an address or command that is not used for normal fuse programming.

According to another embodiment of the present disclosure, an electrical fuse programming control circuit for voltage level trimming may include a fuse cutting signal generating unit (not shown) having a generally similar structure as the fuse cutting signal generating unit 22 shown in FIG. 4 and the comparing unit 32 shown in FIG. 5. The operation of the electrical fuse programming control circuit for voltage level trimming using the fuse cutting signal generating unit (not shown) can be easily understood by referring to the operation of the electrical fuse programming control circuit for voltage level trimming shown in FIG. 5, thus a detailed discussion thereof is omitted.

According to yet another embodiment of the present disclosure, an electrical fuse programming control circuit for mode selection may have a generally similar structure as the electrical fuse programming control circuit for voltage level trimming shown in FIG. 5. In this embodiment, individual fuse blocks are selected in response to a control signal that indicates a specific mode. The control signal for selecting the specific mode is generated by decoding the output signals from the programmed fuse blocks according to information that corresponds to the mode. Even in this embodiment, a comparing unit and/or a fuse cutting signal generating unit may be used to selectively transmit a fuse cutting signal to program a plurality of anti fuses (not shown) of the fuse blocks FB1~FBn. As discussed above, when programming of all of the fuse blocks FB1~FBn is complete, reprogramming of the fuse blocks is not performed when an illegal program command is inputted.

Many changes and modifications to the embodiments described herein may be made. The scope of some changes is discussed above. The scope of others will become apparent from the appended claims.

What is claimed is:

1. An electrical fuse programming control circuit, comprising:
   a plurality of fuse blocks each having a plurality of electrical fuses, wherein each of the plurality of fuse blocks is selected in response to a fuse block select signal, and wherein each of the plurality of fuse blocks is programmed in response to a fuse cutting signal;
   an end fuse block that is enabled in response to an end control signal, wherein the end control signal is enabled when all of the fuse blocks are programmed, and wherein the end fuse block is adapted to generate a programming control signal in response to the fuse cutting signal; and
   a comparing unit adapted to selectively transmit the fuse cutting signal to the plurality of fuse blocks in response to the programming control signal.

2. The electrical fuse programming control circuit according to claim 1, wherein the fuse block select signal includes repair addresses.

3. The electrical fuse programming control circuit according to claim 2, wherein the end control signal includes at least one address that is different from the repair addresses.

4. The electrical fuse programming control circuit according to claim 2, wherein the end control signal includes at least one command that is different from a command for performing a repair operation.

5. The electrical fuse programming control circuit according to claim 1, wherein the fuse block select signal includes a plurality of trimming control signals for voltage level trimming.

6. The electrical fuse programming control circuit according to claim 5, wherein the end control signal includes at least one control signal that is different from the plurality of trimming control signals.

7. The electrical fuse programming control circuit according to claim 5, wherein the end control signal is at least one command that is different from a command for performing a voltage level trimming operation.

8. An electrical fuse programming control circuit, comprising:
   a plurality of fuse blocks each having a plurality of electrical fuses, wherein each of the plurality of fuse blocks is selected in response to a fuse block select signal, and wherein each of the plurality of fuse blocks is programmed in response to a fuse cutting signal;
   an end fuse block that is enabled in response to an end control signal, wherein the end control signal is enabled when all of the fuse blocks are programmed, and wherein the end fuse block is adapted to generate a programming control signal in response to the fuse cutting signal; and
   a fuse cutting signal generating unit adapted to selectively generate the fuse cutting signal in response to the programming control signal.

9. The electrical fuse programming control circuit according to claim 8, wherein the fuse block select signal includes repair addresses.

10. The electrical fuse programming control circuit according to claim 9, wherein the end control signal includes at least one address that is different from the repair addresses.

11. The electrical fuse programming control circuit according to claim 9, wherein the end control signal includes at least one command that is different from a command for performing a repair operation.

12. The electrical fuse programming control circuit according to claim 8, wherein the fuse block select signal includes a plurality of trimming control signals for voltage level trimming.

13. The electrical fuse programming control circuit according to claim 12, wherein the end control signal includes at least one control signal that is different from the plurality of trimming control signals.

14. The electrical fuse programming control circuit according to claim 12, wherein the end control signal includes at least one command that is different from a command for performing a voltage level trimming operation.

* * * * *

UNITED STATES PATENT AND TRADEMARK OFFICE
CERTIFICATE OF CORRECTION

PATENT NO. : 6,842,065 B2
DATED : January 11, 2005
INVENTOR(S) : Jong T. Park

It is certified that error appears in the above-identified patent and that said Letters Patent is hereby corrected as shown below:

<u>Title page,</u>
Item [73], Assignee, please delete "Hynix Semiconductor, Inc.," and insert
-- Hynix Semiconductor Inc. -- in its place, and delete "Kyoungki-Do" and insert
-- Kyoungki-do -- in its place.

Signed and Sealed this

Fifth Day of July, 2005

JON W. DUDAS
*Director of the United States Patent and Trademark Office*